(12) United States Patent
Martin

(10) Patent No.: US 6,370,173 B1
(45) Date of Patent: Apr. 9, 2002

(54) HEAT SINK FOR HAND-HELD, HIGH POWER LASER

(75) Inventor: Danny W. Martin, Vail, AZ (US)

(73) Assignee: Coronado Laser Co., L.L.C., Tucson, AZ (US)

(*) Notice: Subject to any disclaimer, the term of this patent is extended or adjusted under 35 U.S.C. 154(b) by 0 days.

(21) Appl. No.: 09/361,486

(22) Filed: Jul. 26, 1999

(51) Int. Cl.[7] .................................................. H01S 3/04
(52) U.S. Cl. .......................................... 372/36; 372/58
(58) Field of Search ............................. 372/36, 34, 98, 372/65

(56) References Cited

U.S. PATENT DOCUMENTS 4,079,404 A * 3/1978 Comerford et al. ........... 357/19
5,550,853 A   8/1996 Ostler ............................ 372/34
5,561,684 A  10/1996 Martin ......................... 372/107

* cited by examiner

*Primary Examiner*—Leon Scott, Jr.
(74) *Attorney, Agent, or Firm*—Lawrence R. Oremland, P.C.

(57) ABSTRACT

A laser diode is mounted on a plate that fits closely within a mortise in a thermally conductive insert. The insert, in turn, fits closely within a thermally conductive sleeve. The plate has six sides and the laser diode is attached to one of the sides. Heat is conducted away from the remaining five sides of the plate. The insert includes a conic section that fits within a conic section in the sleeve to provide good thermal contact between the insert and the sleeve. The sleeve includes a plurality of holes and contains a fan for circulating air through the sleeve, thereby removing heat from the sleeve. The sleeve includes a cylindrical portion for being held in a hand.

7 Claims, 1 Drawing Sheet

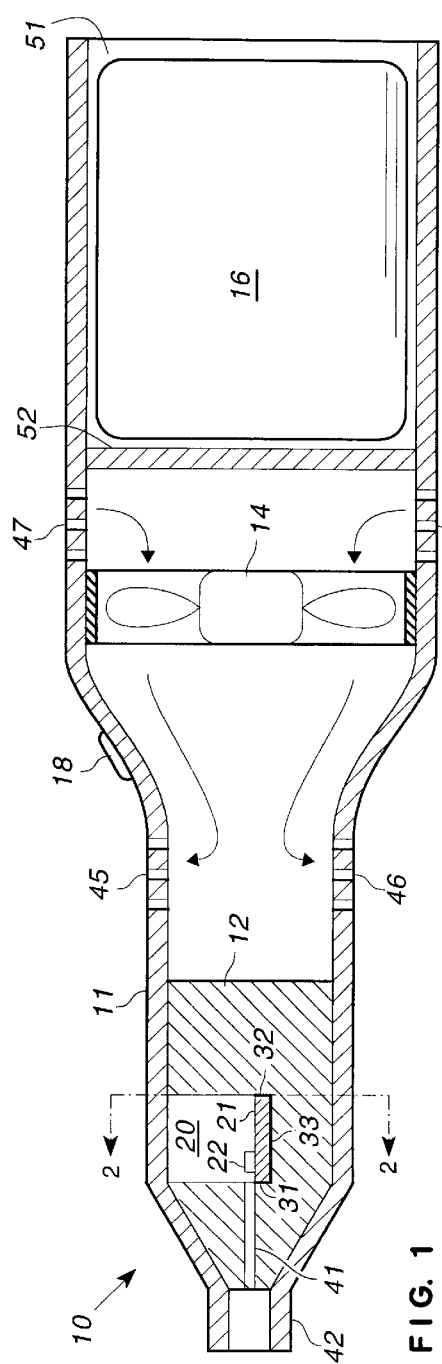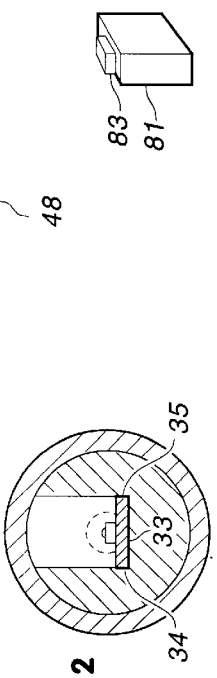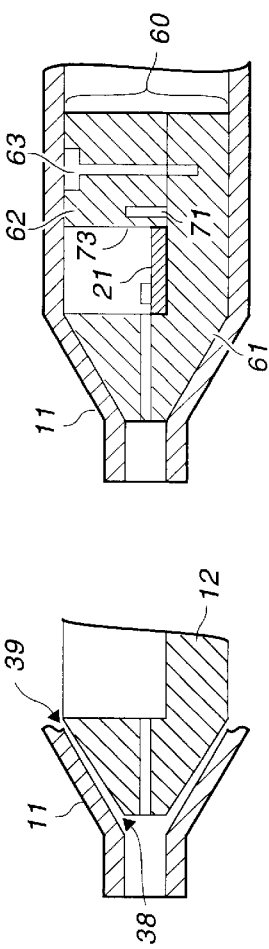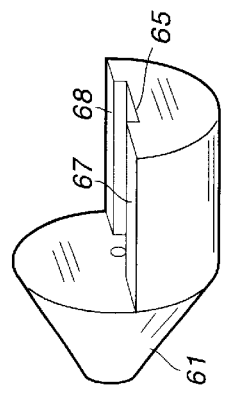

HEAT SINK FOR HAND-HELD, HIGH POWER LASER

BACKGROUND OF THE INVENTION

This invention relates to hand-held laser devices and, in particular, to a compact, effective heat sink for a high power, hand held laser.

A laser diode is a relatively efficient light emitter, converting fifty to sixty percent of applied power into light, the remainder being dissipated as heat. High power, semiconductor lasers are particularly susceptible to damage because the heat is generated in a small volume at a high rate. Because of this, laser diodes are typically mounted with the active surface of the die, i.e. the surface containing the laser diode, mounted face down on a heat sink to minimize the thermal path from the diode to the heat sink. As used herein, "laser diode" refers to a semiconductor device having one or more laser diodes on a single die, typically as parallel stripes, and operated together as a set. In other words, the use of the singular does not exclude the plural in reference to a laser diode.

A heat sink of the prior art includes a mass of metal, typically copper, attached to the packaged semiconductor laser device. Thus, heat flows from the diode junction, through several interface layers, through the metal tab of the semiconductor package to the heat sink. The heat sink typically extends away from the semiconductor device and the heat flows essentially in one direction away from the junction.

There are several interfaces in the thermal path away from the laser diode to a heat sink and an intimate contact must be maintained between adjoining surfaces to assure a low thermal resistance across the interfaces. Within the semiconductor device, compatible metal layers, e.g. nickel, gold, and other metals, are deposited in a clean room environment to assure a good thermal and mechanical bond between the layers. The bond between the semiconductor device and a heat sink is typically aided by thermally conductive grease that helps "wet" the two surfaces to assure a large contact area even if the surfaces are macroscopically rough, e.g. a matte finish rather than a high polish.

U.S. Pat. No. 5,561,684 (Martin) discloses a diode laser pump source in which a laser diode is soldered to a heat sink and the heat sink is mounted on a flat portion of a base having a semicircular cross-section. The base fits within a cylindrical casing that radiates and dissipates heat in a 360° pattern and acts as another heatsink for the laser diode.

U.S. Pat. No. 5,550,853 (Ostler) discloses a compact gas discharge laser having a heat sink that circumferentially surrounds the laser and includes an external blower provides axial cooling through a port in the housing containing the laser.

Even a laser diode properly mounted on a heat sink often must be operated intermittently to give the laser diode a chance to cool between operations. An alternative is a larger heat sink or a lower power laser, neither of which may be feasible in many applications. For example, many areas of medicine have developed uses for lasers in the treatment of patients, such as a blue laser for the treatment of skin disorders by dermatologist. In such applications, a hand held device, even if coupled to a power source by a cable, is preferable to an appliance that must be maneuvered about a patient. Thus, simply providing a large heat sink is not feasible.

A hand held device puts severe restrictions on the size of a heat sink. A laser that is adequately cooled is not of much use if a physician cannot comfortably hold and manipulate the device. Further, a human hand is both a source of heat and sensitive to temperature, factors which must be considered in designing a heat sink for a hand held product.

In view of the foregoing, it is therefore an object of the invention to provide a heat sink for a high power laser diode, i.e. a laser diode dissipating a total power of one to sixty watts or more.

Another object of the invention is to provide a heat sink for a laser diode wherein the heat sink spreads heat in many directions away from the laser diode.

A further object of the invention is to provide a heat sink for a laser diode wherein the heat sink provides a low resistance path for heat to flow away from the laser diode.

Another object of the invention is to provide a heat sink for a laser diode wherein the heat sink provides a convenient hand grip.

A further object of the invention is to provide a heat sink that removes heat from five sides of a semiconductor laser.

SUMMARY OF THE INVENTION

The foregoing objects are achieved in this invention in which a laser diode is mounted on a plate that fits closely within a mortise in a thermally conductive insert. The insert fits closely within a thermally conductive sleeve. The plate has six sides and the laser diode is attached to one of the sides. Heat is removed from the remaining five sides of the plate. The insert includes a conic section that fits within a conic section in the sleeve to provide good thermal contact between the insert and the sleeve. The sleeve includes a plurality of holes and contains a fan for circulating air through the sleeve, thereby removing heat from the sleeve. The sleeve has a cylindrical portion for being held in a hand.

BRIEF DESCRIPTION OF THE DRAWINGS

A more complete understanding of the invention can be obtained by considering the following detailed description in conjunction with the accompanying drawings, in which:

FIG. 1 is a longitudinal cross-section of a hand held heatsink constructed in accordance with a preferred embodiment of the invention;

FIG. 2 is a cross-section taken along line 2—2 in FIG. 1;

FIG. 3 illustrates the taper of the heat sink within the sleeve;

FIG. 4 is a cross-section of an alternative embodiment of the invention;

FIG. 5 is a perspective view of a heat sink constructed in accordance with an alternative embodiment of the invention; and FIG. 6 illustrates an alternative mounting for a laser diode.

DETAILED DESCRIPTION OF THE INVENTION

The invention uses a number of components in addition to the small metal tab on a semiconductor device, each of which could be referred to as a heat sink. In a purely thermodynamic sense, ambient air or the atmosphere is the only sink because air is the reservoir to which the heat ultimately flows. The metal members between the laser diode and the air are merely conduits.

For the sake of description, as used herein, "heat sink" refers to the combination of elements as defined, "plate" refers to the small metal tab to which a laser diode is soldered and which typically includes a hole for attaching the diode to another structure, "insert" refers to the metal slug, described below, to which the metal tab is attached, and "sleeve" refers to a cylindrical member into which the metal slug closely fits.

In FIG. 1, laser device 10 includes sleeve 11, insert 12, fan 14, and power source or battery 16 for supplying power to the laser diode and to the fan. Switch 18 selectively controls the application of power to the devices within sleeve 11. Sleeve 11 is preferably made from a thermally conductive material, metal, or metal alloy such as aluminum, brass, or copper and has a circular cross-section, at least one portion of which has a diameter that is comfortable to hold in the hand, e.g. a diameter of 35 mm. or less.

Insert 12 is a solid mass of thermally conductive material such as aluminum, brass, or copper having a circular cross-section closely fitting within sleeve 11. Insert 12 includes mortise 20 for receiving plate 21, to which is soldered laser diode 22. Plate 21 is dimensioned to fit closely within mortise 20 and may include conductive grease, deformable shims, or other conductive material to thermally couple five sides of the plate to insert 12. Plate 21 is preferably pressed into place but can be fastened with a bolt (not shown) instead.

FIG. 2 is a cross-sectional view through the mortise in insert 12. Considering FIG. 1 and FIG. 2 together, sides 31, 32, 33, 34, and 35 of plate 21 closely fit within mortise 20 to provide good thermal coupling from the plate to insert 12. In contrast to devices of the prior art that draw heat away from diode 22 through the bottom of plate 12, insert 12 withdraws heat through five sides, thereby lowering the thermal resistance of the path from diode 22 to sleeve 11 and, ultimately, to the air. Insert 12 helps to spread heat about the entire 360° circumference of itself and sleeve 11.

The distal or left-hand end of insert 12, as illustrated in FIG. 1 is a conic section, specifically the frustum of a cone. This shape provides a compression fit between the end of insert 12 and sleeve 11, thereby insuring good thermal conductivity between the two elements. As illustrated in FIG. 3, the compression can be enhanced by having the inside taper of sleeve 11 slightly greater than the outside taper of insert 12. The difference is exaggerated in FIG. 3 for the purpose of illustration but gap 38 at the tip of insert 12 is greater than gap 39 at the base of the cone. In practice, a difference in taper of 5° or less is sufficient.

In FIG. 1, insert 12 includes bore 41 parallel with the longitudinal axis of device 10 and aligned with laser diode 22. Bore 41 preferably contains a segment of glass fiber (not shown) for conducting light from laser diode 22 to the tip of device 10. Outer segment or tip 42 is optionally provided with additional optics, such as a lens, filter, or a larger fiber, as determined by the particular application for device 10. Tip 42 preferably includes internal threading (not shown) for securing the additional optics.

The middle portion of device 10 includes fan 14 for forcibly circulating air through the interior of sleeve 11. Sleeve 11 includes a plurality of holes, such as holes 45, 46, 47, and 48 located about the circumference thereof on either side of fan 14. Air circulating through the holes removes heat from the interior of sleeve 11 and from sleeve 11 itself. As illustrated in FIG. 1, air enters through holes 47 and 48 and exits through holes 45 and 46. The air could flow in either direction.

Battery 16 fits within compartment 51 at the proximal end of sleeve 11. Compartment 51 is defined by wall 52, which need not completely close off the end of sleeve 11 but merely needs to contain battery 16. Power leads (not shown) extend from battery to fan 14, diode 22, and any other electronics within sleeve 11. The distal end of sleeve 11 is closed by a suitable cap (not shown).

FIGS. 4 and 5 illustrate an alternative embodiment of the invention in which the insert is made in two pieces to facilitate machining. The two pieces, when combined, form a mortise as described above. Insert 60 includes main body 61 and closing member 62. Insert 60 includes threaded bore 63 for receiving a bolt (not shown) to fasten the two parts together. As shown in FIG. 5, main body 61 is essentially cut in half cross-wise behind the conic section. Although illustrated as beginning at the base of the frustum, the mortise need not be so located but could be separated from the frustum by a cylindrical portion.

Closing member 62 includes notch 71 near surface 73 to provide stress relief and enable a slight amount of compression on plate 21. After plate 21 is put in place, closing member can be lightly compressed against the plate and held securely in place by the bolt in bore 63. Thus combined, insert 60 fits snugly within sleeve 11.

Referring to FIG. 5, the flat surface forming a diameter of insert 60 is cut to form keyway 65 and shoulders 67 and 68. The walls of keyway 65 can be square or tapered with respect to the floor of the keyway. Closing member 62 includes a complementary shape for fitting within keyway 65 and resting on shoulders 67 and 68. Plate 21 fits snugly within keyway 65 and, with closing member 62 in place, there is good thermal contact to five sides of plate 21.

FIG. 6 illustrates what is known in the art as a "C-mount" for a laser diode. Specifically, plate 81 has laser diode 83 soldered to a short side rather than on a major surface of the plate. With appropriate changes in the dimensions of the mortise, a C-mounted laser diode can be used in a heat sink constructed in accordance with the invention. As with plate 21, heat is withdrawn from five major surfaces of plate 81.

In operation, laser diode 22 (FIG. 1 or FIG. 4) generates a significant amount of heat. In accordance with the invention, the heat is removed laterally and vertically away from diode 22 by virtue of the coupling to plate 21. Within insert 12 or 60, heat is dispersed radially and longitudinally, coupling to sleeve 11 over a broad area. The broad area and good thermal contact provide a low resistance path for the heat, which is ultimately removed primarily by air from fan 14 (FIG. 1). There may be some radiation and some conduction to a hand but this is believed minor compared to the amount of cooling by forced convection from fan 14.

The invention thus provides a heat sink for a high power laser diode wherein the heat sink removes heat from five sides of a semiconductor laser, spreads the heat in many directions, and provides a low resistance path for heat to flow away from the laser diode. The heat sink further provides a convenient hand grip for a hand held device.

Having thus described the invention, it will be apparent to those of skill in the art that many modification s can be made with the scope of the invention. For example, a laser diode could be soldered directly to the insert, with the depth of the mortise adjusted accordingly to maintain alignment with the bore. Thus constructed, heat is removed laterally and vertically as it is from plate 21. Depending upon the power level of diode 22, battery 16 can be replaced by a suitable power supply connected to a wall socket by a power cord. The location of fan 14 and battery 16 can be interchanged, with the proximal end of sleeve 11 left open or covered with a grill to provide axial air flow through sleeve 11, thereby cooling the battery or power supply in addition to the diode.

The insert can be in the shape of two conic sections instead of a conic section and a right circular cylindrical. The laser diode and the fan can be independently operated, e.g. by using a thermally sensitive switch to operate the fan as needed.

What is claimed as the invention is:

1. A laser device comprising:

a sleeve including a thermally conductive cylinder;

an insert that closely fits with said cylinder, said insert including a mortise;

a laser diode mounted within said mortise whereby heat is removed radially and longitudinally from said laser diode by conduction through said insert to the surrounding cylinder.

2. The laser device as set forth in claim 1 and further including a plate having six sides, wherein said laser diode is attached to one of said sides and the remaining five sides fit closely within said mortise whereby heat is removed from the five sides of said plate.

3. The laser device as set forth in claim 1 wherein said insert includes a conic section at one end thereof, said sleeve includes a conic section at one end thereof and said insert is pressed into said sleeve to provide good thermal contact between the conic sections.

4. The laser device as set forth in claim 3 wherein the tapers of the conic sections differ by 5° or less.

5. The laser device as set forth in claim 1 and further comprising:

an electric fan located within said sleeve;

wherein said sleeve includes a plurality of holes permitting air to enter and leave said sleeve.

6. The laser device as set forth in claim 5 and further including a battery for powering said laser diode and said fan.

7. The laser device as set forth in claim 6 wherein said battery is located within said sleeve.

* * * * *